(12) United States Patent  
Berthelot (10) Patent No.: US 9,802,817 B2
(45) Date of Patent: Oct. 31, 2017

(54) METHOD FOR MAKING SUSPENDED ELEMENTS WITH DIFFERENT THICKNESSES FOR A MEMS AND NEMS STRUCTURE

(71) Applicant: Commissariat A L'Energie Atomique et aux Energies Alternatives, Paris (FR)

(72) Inventor: Audrey Berthelot, Saint Ismier (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 6 days.

(21) Appl. No.: 14/707,216

(22) Filed: May 8, 2015

(65) Prior Publication Data

US 2015/0353350 A1 Dec. 10, 2015

(30) Foreign Application Priority Data

Jun. 5, 2014 (FR) ...................... 14 55107

(51) Int. Cl.
   *B81C 1/00* (2006.01)
(52) U.S. Cl.
   CPC ...... *B81C 1/00357* (2013.01); *B81C 1/00349* (2013.01)
(58) Field of Classification Search
   CPC .................. B81C 1/00357; B81C 1/00349
   See application file for complete search history.

(56) References Cited

U.S. PATENT DOCUMENTS

| 2010/0006840 A1* | 1/2010 | Robert ............... B81C 1/00039 257/49 |
| 2011/0156175 A1* | 6/2011 | Mohanakrishnaswamy ........... B81C 1/00246 257/414 |
| 2013/0181302 A1 | 7/2013 | Giroud et al. |
| 2014/0175525 A1* | 6/2014 | Feyh ................... B81C 1/00246 257/254 |

(Continued)

FOREIGN PATENT DOCUMENTS

| EP | 2 599 745 A1 | 6/2013 |
| EP | 2 599 746 A1 | 6/2013 |

(Continued)

OTHER PUBLICATIONS

French Preliminary Search Report issued Feb. 27, 2015 in French Application 14 55107, filed on Jun. 5, 2014 (with English Translation of Categories of Cited Documents).

(Continued)

*Primary Examiner* — Latanya N Crawford
(74) *Attorney, Agent, or Firm* — Oblon, McClelland, Maier & Neustadt, L.L.P.

(57) ABSTRACT

Method for making a N/MEMS device including a structure provided with an active part having a first suspended element and a second suspended element with different thicknesses, the method comprising the following steps of:
   forming, in a first substrate (100), a sacrificial zone (105),
   transferring a given layer onto the sacrificial zone,
   defining in said given layer a first suspended element facing the first sacrificial zone,
   defining a second suspended element in the first substrate and said given layer,
   releasing at least the first suspended element.

19 Claims, 9 Drawing Sheets

(56) References Cited

U.S. PATENT DOCUMENTS

| | | | | |
|---|---|---|---|---|
| 2015/0329986 A1* | 11/2015 | Ollier | ................... | B81C 1/00206 |
| | | | | 205/666 |
| 2016/0090297 A1* | 3/2016 | Zhang | ................... | B81B 7/0048 |
| | | | | 257/417 |
| 2016/0093530 A1* | 3/2016 | Harley | .............. | H01L 21/76898 |
| | | | | 438/667 |

FOREIGN PATENT DOCUMENTS

| WO | WO 2007/004119 A2 | 1/2007 |
|---|---|---|
| WO | WO 2009/072704 A1 | 6/2009 |

OTHER PUBLICATIONS

Ph. Robert et al. "M & NEMS: A new approach for ultra-low cost 3D inertial sensor", IEEE sensors, 2009, 4 pages.

* cited by examiner

METHOD FOR MAKING SUSPENDED ELEMENTS WITH DIFFERENT THICKNESSES FOR A MEMS AND NEMS STRUCTURE

TECHNICAL FIELD AND PRIOR ART

The present invention relates to a method for making a structure provided with at least one active part having zones with different thicknesses. This structure can be implemented within the scope of manufacturing microelectromechanical (MEMS, including MOEMS ("Micro-Opto-Electro-Mechanical Systems")) systems and/or nano-electromechanical systems (NEMS, including NOEMS for "Nano-Opto-Electro-Mechanical Systems") for making for example sensors and/or actuators.

MEMS and NEMS devices can be provided with a fixed part and at least one suspended part, being suspended with respect to the fixed part, the suspended part being generally called an "active part" and able to be moved and/or deformed under the effect of an external action, for example a mechanical and/or electrical and/or magnetic action. This movement can for example enable a detection of an acceleration, a rotation to be performed.

Currently, there are some sensors consisting of an active part including suspended elements with different thicknesses: a first element, in particular of the NEMS type made in a layer with a thickness for example in the order of several hundreds of nanometers may for example to form a strain gauge, whereas a second suspended element, in particular a MEMS, having typically a thickness of several tens of micrometers, may for example to form an inertial mass.

Document "M&NEMS: a new approach for ultra low cost 3D inertial sensor", of P. Robert et al., IEEE Sensors 2009 conf., 25-28 Oct. 2009 provides a method for making MEMS&NEMS structures with an active part provided with elements with different thicknesses and which is partially formed in the surface layer of an SOI substrate.

Document EP 2° 599° 746 A1 provides an alternative method for making MEMS&NEMS structures from a so-called "bulk" substrate.

In the methods described in these documents, the first suspended element and the second suspended element are at least partially formed in a layer made by epitaxial growth.

But, the epitaxy can turn out to be a lengthy and expensive step which requires the use of specific equipments. Besides, the thickness of the layers that it is possible to obtain by epitaxy is generally restricted.

Document EP 2° 599° 745 A1 provides an embodiment enabling MEMS&NEMS structures to be made without resorting to an epitaxy.

In this embodiment, the definition of the lowest thickness suspended element comprises making trenches and then etching under a zone of the surface layer of the bulk substrate located between the trenches for joining these trenches and releasing this zone forming the suspended element.

One drawback of this method resides in the absence of accurate control in the geometry of the suspended element.

The problem of finding a method for making a structure provided with an active part including suspended elements with different thicknesses and which does not have the above drawbacks, and in particular which does not require necessarily an epitaxy step for making the suspended elements and allowing an accurate definition of the suspended elements arises.

DISCLOSURE OF THE INVENTION

Thus, the invention relates to a method for making a structure including an active part comprising at least one first suspended element and one second suspended element with different thicknesses, the method comprising the steps of:
Forming, in a first substrate, a first sacrificial zone,
transferring, onto a first face of the first substrate, a given layer extending on the first sacrificial zone,
defining, in said given layer, at least one first suspended element facing the first sacrificial zone, the definition of the first element comprising forming one or more first trenches having a bottom revealing the first sacrificial zone,
defining at least one second suspended element by forming one or more second trenches in the first substrate and through said given layer, the second suspended element thus having a thickness $e_2$ higher than the thickness $e_1$ of the first suspended element,
releasing the first suspended element, this release comprising removing the first sacrificial zone.

Thus, by transferring the given layer onto the first substrate, epitaxy can be avoided to form the first suspended element and the second suspended element.

The first sacrificial zone can act as an etching stop zone upon defining the first element in the given layer. This can enable the first element to be accurately defined.

Here, the first sacrificial zone is removed only after the first element and the second suspended element have been defined.

This first sacrificial zone can also act as a zone for protecting the first suspended element upon defining the second suspended element, in particular when this definition is made by etching through a second face of the first substrate opposite to the first face.

The formation of the sacrificial zone can comprise making at least one hole through a first face of the first substrate and then filling the hole with a first material.

The method can further comprise, after forming the first sacrificial zone, a step of transferring a second substrate onto the first substrate. This transfer is performed either on the second face of the first substrate, or on the given layer.

According to a first possibility of implementing the method, the following are made prior to defining the second suspended element, in this order: transferring the given layer onto the first substrate, and then defining the first suspended element in said given layer, and then transferring the second substrate onto the first substrate.

In this case, after defining the first suspended element in said given layer and transferring the second substrate onto the first substrate, a filling of the first trenches with a so-called "sacrificial material" is made, the first trenches filled with the sacrificial material forming another sacrificial zone provided about the first element.

The release of the first element also comprises in this case removing this other sacrificial zone.

Advantageously, the sacrificial material can be the same as that of the first sacrificial zone. This facilitates the final release of the first suspended element.

According to a second possibility for implementing the method, the following is made in this order: the step of transferring the second substrate onto the first substrate, and then the step of transferring said given layer onto the first substrate, and then the step of defining the first suspended element in said given layer.

The second substrate can be assembled to the first substrate via a tie layer including at least one portion called a second sacrificial zone provided facing the first suspended element and a region of the first substrate in which the second suspended element is made or intended to be made.

In this case, the release of the first suspended element can comprise removing from the second sacrificial zone. This removal can also enable the second suspended element to be released.

The first sacrificial zone and the second sacrificial zone can be based on a same material. This makes the final release of the first suspended element and the second suspended element easier.

In this case, and in that where a filling of the first trenches with a so-called "sacrificial material" is made, the sacrificial material can be the same as that of the first sacrificial zone and the second sacrificial zone.

The tie layer can further advantageously act as an etching stop zone upon forming the second trenches about the second suspended element.

According to a possible implementation, a cavity can be provided on a face of the second substrate, the transfer of the second substrate onto the first substrate being made such that this cavity is provided facing a region of the first substrate in which the first element and the second element are intended to be formed.

A cavity in the second substrate can in particular allow to increase the space in which the first suspended element and the second suspended element can be moved.

According to a possible implementation of the method for which the hole made is a blind hole, after transferring the second substrate onto the first substrate and prior to forming the second suspended element, a thinning of the first substrate, so as to remove a thickness located on the side of a second face of the first substrate, which face is opposite to said first face, can be made. This thinning can be continued until the first sacrificial zone is reached.

In this case, the first sacrificial zone can act as an etching stop zone. The thinning of the first substrate enables the thickness of the second suspended element formed in the thickness of the first substrate to be adjusted.

According to a possible implementation of the method, the given layer can be based on a semi-conductor material, advantageously single crystal Si.

According to a possible implementation of the method, the transfer of said given layer can comprise the steps of:
  transferring another substrate comprising this given layer or covered by this given layer, and then
  removing a thickness of this other substrate so as to preserve the given layer.

The removal of this thickness of this other substrate can be made using a Smartcut™ type method.

The first suspended element can be provided with a given width whereas the hole can have a cross-section measured in the same direction as the given width which is higher than the given width in order to be able to completely release the first element.

According to a possible implementation, the first substrate is a so-called "bulk" substrate.

In this case, the use of a more expensive semi-conductor on insulator type substrate can be advantageously dispensed with.

Advantageously, the first substrate is single crystal silicon.

Further, the second substrate can also be a bulk substrate. Advantageously, the second substrate is single crystal silicon.

The present invention also relates to a method for manufacturing a MEMS and/or NEMS device comprising making a structure according to a method as previously defined.

BRIEF DESCRIPTION OF THE DRAWINGS

The present invention will be better understood upon reading the description of exemplary embodiments given by way of purely indicating and in no way limiting purposes, making reference to the appended drawings wherein.

Identical, similar or equivalent parts of the different figures bear the same reference numerals so as to facilitate switching from one figure to the other.

The different parts represented in the figures are not necessarily drawn at a uniform scale, to make the figures more legible.

Further, in the description hereinafter, terms that depend on the orientation of the structure as for example "side", "upper", "lower", "under", "over", are applied by considering that the structure is oriented in the way illustrated in the figures.

DETAILED DISCLOSURE OF PARTICULAR EMBODIMENTS

In the present application, an "active part" of a MEMS and/or NEMS structure designates a suspended part, likely to be moved and/or to be deformed under the effect of an external action which can be for example a mechanical, and/or electrical, and/or magnetic action.

An element which will be called a "first suspended element" can form a NEMS part of a MEMS&NEMS structure, whereas another element which will be designated as a "second suspended element" can form a MEMS part of the MEMS&NEMS structure.

In the methods described, only a first suspended element and a second suspended element are formed for the sake of simplicity. However, the methods according to the invention enable one or more first suspended elements and one or more second suspended elements to be made.

A first example of the method for making a structure including a first active part provided with zones with different thicknesses will now be described in connection with FIGS. 1A to 1K.

Figure 1A:
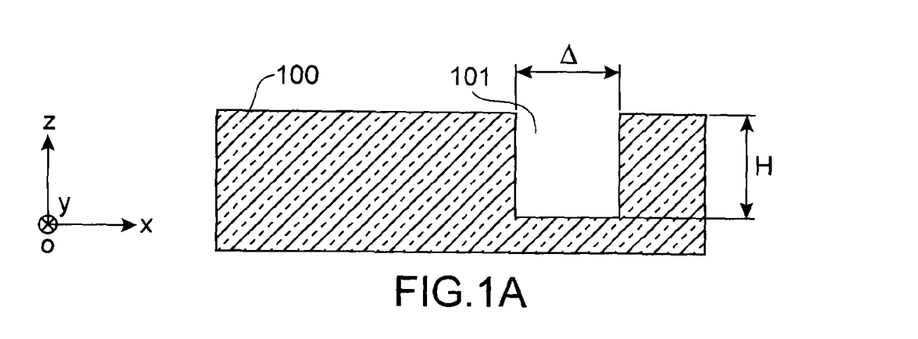
FIGS. 1A to 1K are schematic representations of different steps of a method for making a structure with an active part provided with suspended elements with different thicknesses according to a first embodiment.

A starting material of this method can be a first substrate 100, in particular a "bulk" substrate which can consist of a semi-conductor material such as Si, or for example based on Ge or SiGe or GaN or SiC, and wherein a hole 101 is provided (FIG. 1A). The hole 101 can be made for example by a DRIE (Deep Reactive Ion Etching) type dry anisotropic etching through a first face of the first substrate 100. The hole 101 can be formed with a depth also called height H (measured in parallel with a z-axis of an orthogonal reference frame [0; x; y; z] in FIG. 1A) for example between several micrometers and several tens of micrometers, and a critical dimension also called width Δ (measured in parallel to the plane [0; x; y] of the orthogonal reference frame [0; x; y; z]) between about several tens of nanometers and several micrometers.

Figure 1B:
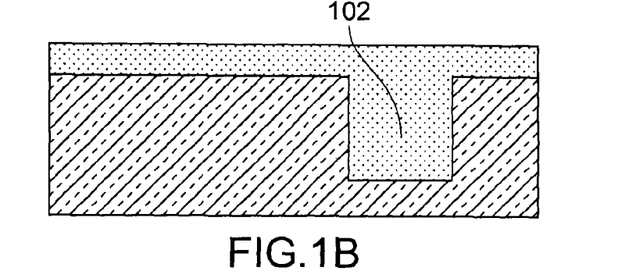
Figure 1C:
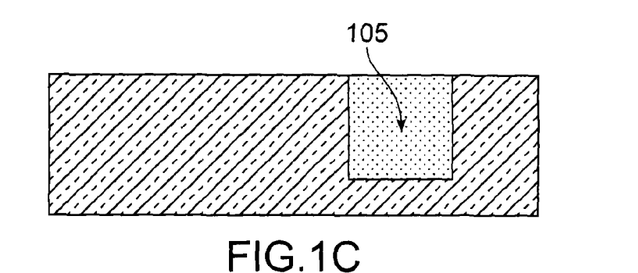

Then, a filling of the hole 101 is made with a material 102 intended to form an etching stop material and a sacrificial material during the method (FIG. 1B). The filling material 102 is preferably a material chosen so as to be able to be selectively etched towards the material of the first substrate 100. The material 102 can be, for example, a dielectric material such as $SiO_2$. In this case, the material filling 102 can be made for example by oxidizing the walls and the bottom of the hole 101 or by performing an oxide deposition which can be conform. The filling can be made such that the material 102 projects from the mouth of the hole 101 and covers a so-called "upper" face of the first substrate 100. In this case, a removal of the material 102 in a zone located on the upper face and beyond the mouth of the hole 101 is made, for example via a CMP (Chemical Mechanical Planarization) type planarization with a stop on the upper face of the first substrate 100 (FIG. 1C). The hole 101 filled with the material 102 makes up a zone 105 intended to form an etching stop zone and a sacrificial zone intended to be subsequently removed.

Then, the upper face of the first substrate 100 can be prepared for bonding or transferring onto a layer 301 wherein the first suspended element and a part of the second suspended element are intended to be made. This preparation can be carried out for example using a plasma treatment.

The transferred layer 301 can be semi-conducting and in particular a superficial layer of another substrate 300 intended to be split from this other substrate 300. The thickness of this layer 301 can be between several nanometers and several tens of nanometers, for example in the order of 100 nm, but the transfer possibly enables layers with higher thicknesses to be assembled.

Figure 1D:
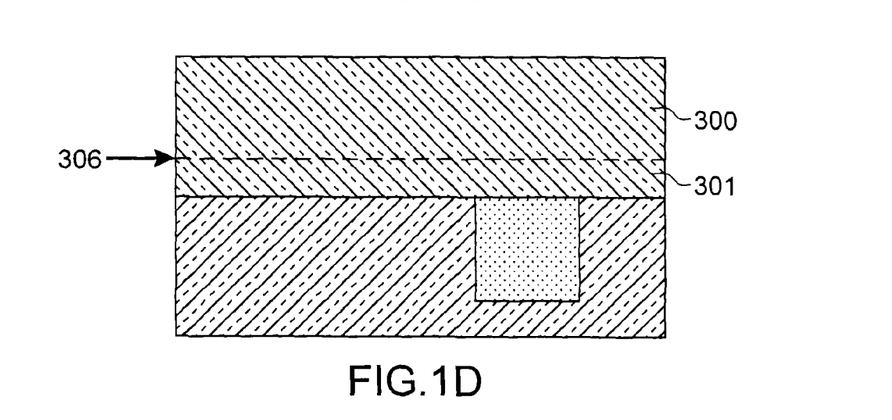
Figure 1E:
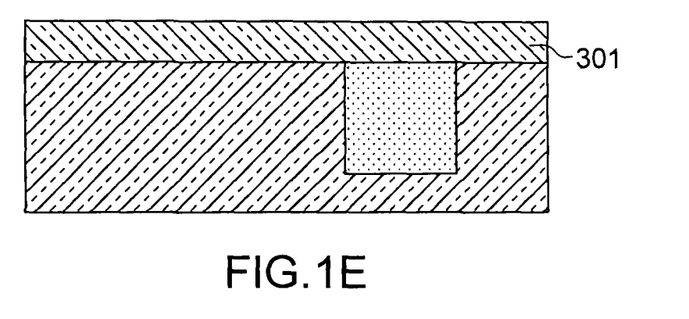
Figure 1F:
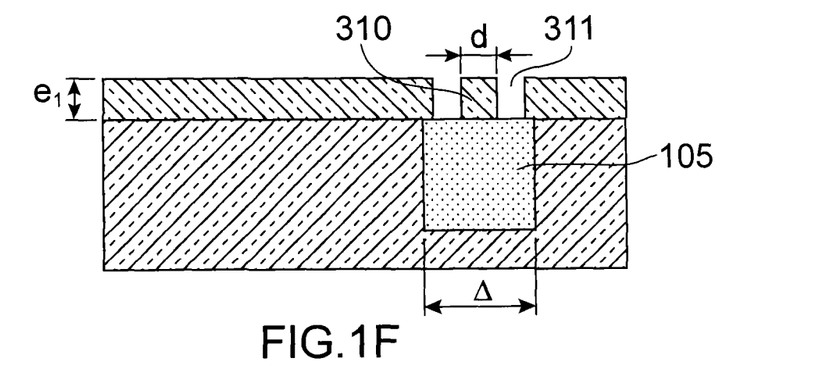

Thus, the layer 301 of this other substrate 300 is first assembled on the upper face of the first substrate 100, for example by molecular bonding (FIG. 1D). Such a method does not necessarily require an alignment.

Then, at least a thickness of the other substrate 300 is removed. This removal can be made by a splitting method in which, after a longitudinal weakness zone 306 has been created in the substrate 300 which separates a part called "handle" from the superficial layer 301, the handle is split so as to preserve only the superficial layer 301. The weakness zone 306 can be created for example via a $H_2$ implantation possibly made before assembly with the first substrate 100. The splitting step (FIG. 1E) can be preceded by an annealing step.

Then, the first suspended element 310 is defined in the superficial layer 301. For this, a lithography step of the layer 301 can be carried out to bound a zone for example in the shape of a beam intended to form a strain gauge. The beam may have a width d (measured in parallel to the plane[0; x; y] of an orthogonal reference frame [0; x; y; z] in FIG. 1F) between for example 100 nm and 1 μm, a thickness $e_1$ (measured in parallel to an z-axis of the orthogonal reference frame [0; x; y; z]) between for example 100 nm and 1 μm and a length between 100 nm and 100 μm. The first suspended element 310 can be provided with a width d lower than the cross-section Δ of the hole 101 filled with the material 102. This configuration is advantageous because the layer 102 acts as a layer for protecting the first element and as an etching stop layer upon defining the second suspended element. The etching of the layer 301 is made so as to form trenches 311 about the first suspended element 310 and to stop on the first sacrificial zone 105.

Figure 1G:
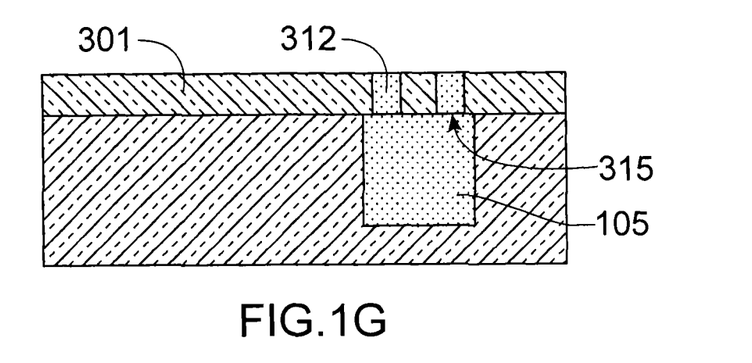

These trenches 311 can then be filled with a material 312 called a "second material" and which can advantageously be the same as that 102 for filling the hole 101 formed in the first substrate 100 (FIG. 1G). The material 312 for filling the trenches 311 is preferably a material chosen so as to be able to be selectively etched towards the material of the first substrate 100 and of the layer 301. The material 312 for filling the trenches 311, for example $SiO_2$, forms another sacrificial zone 315 about the first suspended element 310 which is in contact with the sacrificial zone 105 and which is also intended to be subsequently removed.

Then, the first substrate 100 is assembled with a substrate 200 called a second substrate. The second substrate 200 can be in particular a bulk substrate of a semi-conductor material such as Si, or for example based on Ge or SiGe or GaN or SiC, or based on another material such as for example glass.

Figure 1H:
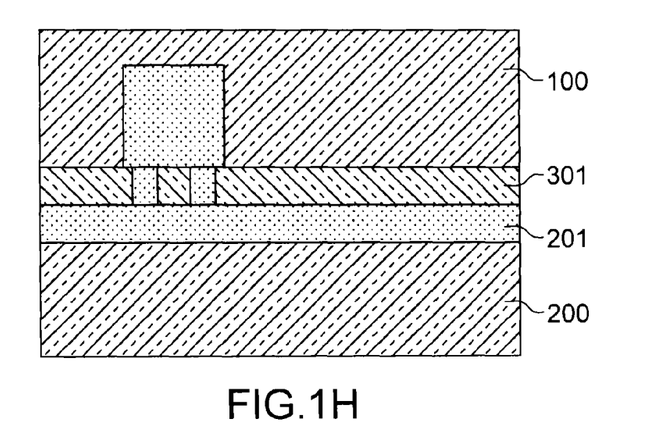

The second substrate 200 is, according to a particular exemplary embodiment, covered with a so-called "tie" layer 201 allowing bonding or promoting adhesion to the first substrate 100 (FIG. 1H). A transfer, for example via a molecular bonding or an anodic bonding or an eutectic bonding, can be made.

Figure 1I:
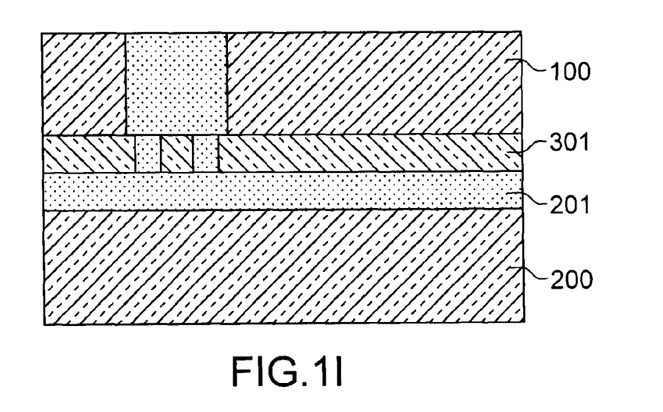

Then, a thinning of the first substrate 100 can be made so as to make a removal of its thickness at its lower face, that is the face opposite to the upper face of the first substrate 100 against which the tie layer 201 of the second substrate 200 is provided. This thinning can be implemented so as to reveal the sacrificial zone 105 made in the thickness of the first substrate 100, wherein the sacrificial zone 105 can then be a mark for stopping the etching (FIG. 1I). The thinning can for example be made by "back-grinding", and then mechanical-chemical polishing.

This thinning enables the thickness of the second suspended element corresponding for example to the MEMS part in the case of so-called MEMS&NEMS structures to be defined.

Then, the second suspended element 110 is defined in the first substrate and the superficial layer 301. For this, a lithography step can be carried out to bound a zone, for example, in the form of several beams with widths between for example 0.1 μm and 100 μm, of the thickness $e_2$ (measured in parallel to a z-axis of an orthogonal reference frame [0; x; y; z] in FIG. 1J) for example between 10 μm and 100 μm and a length between 10 μm and 100 μm.

Figure 1J:
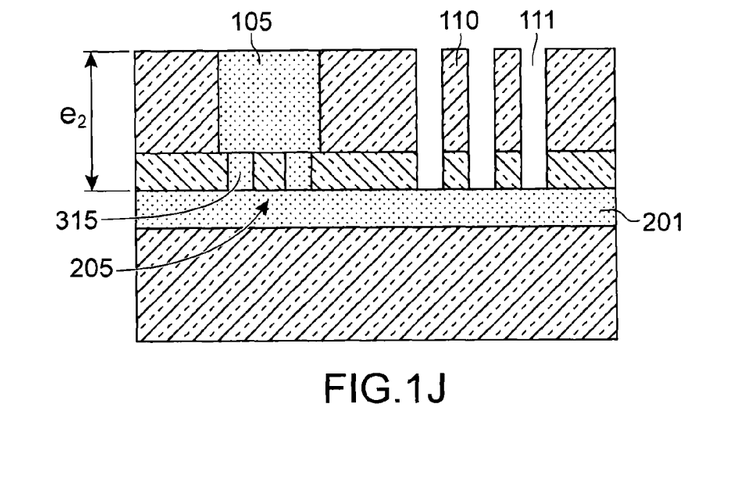

The etching of the first substrate 100 and the layer 301 is made such that trenches 111 called second trenches are formed about the second suspended element, for example by a DRIE (Deep Reactive Ion Etching) technique. The bottom reveals the tie layer 201 which can here act as an etching stop layer.

Figure 1K:
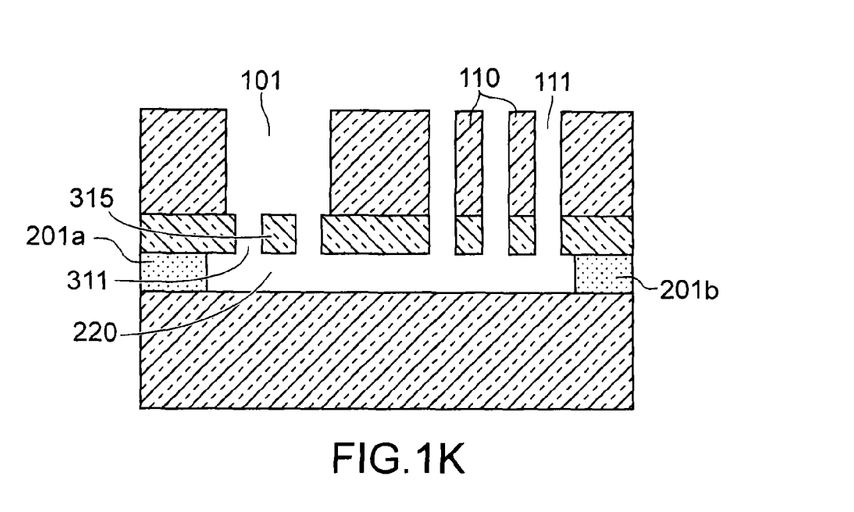

Then, a release of the first suspended element 310 is carried out by removing the sacrificial zones 105 and 315 located therearound. Another sacrificial zone 205 corresponding to a portion of the superficial layer 201 which extends facing the first element 310 and the second suspended element 110 is also removed. The removal of this other sacrificial zone 205 enables the second suspended element 110 to be released. The removal of the sacrificial zones results in uncovering the trenches 111, 311, and the hole 101 (FIG. 1K).

In a case where the sacrificial zones 105, 315, 205 consist of the same material, the removal is facilitated. The material of the sacrificial zones is preferably also provided so as to be able to be selectively etched towards the material(s) of the substrates 100, 200 and of the layer 301. In the case, for example, where the sacrificial zones 105, 315, 205 are based on SiO$_2$, the release can be conducted by etching using hydrofluoric acid.

At the end of this release, portions of the tie layer 201 can be preserved so as to form pillars 201a, 201b ensuring the maintenance of the assembly between the first substrate 100 and the second substrate 200. These pillars 201a, 201b are distributed about the suspended first element 310 and second element 110.

Figure 2A:
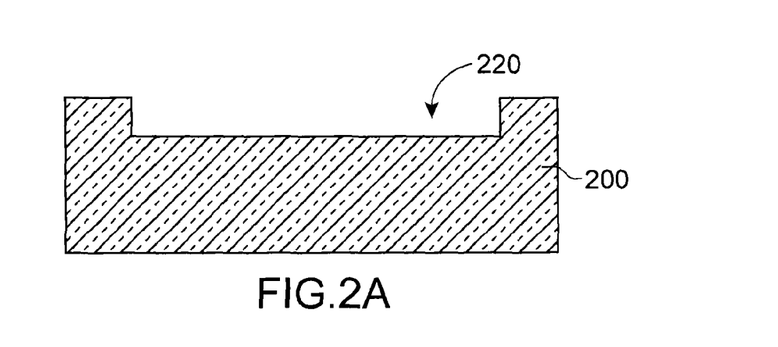
FIGS. 2A to 2C are schematic representations of different steps for making an alternative of the method of the first embodiment.
Figure 2B:
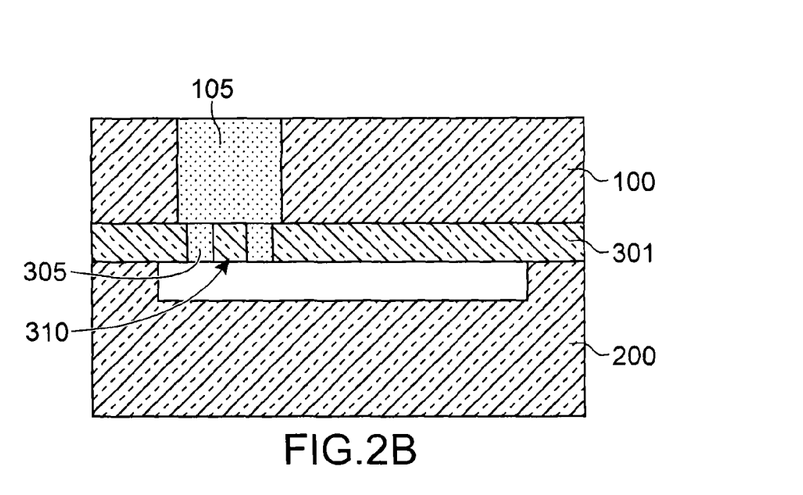
Figure 2C:
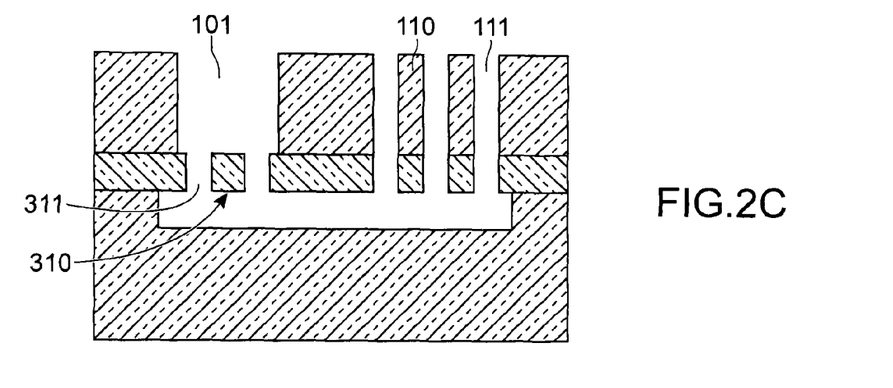

An alternative of the first exemplary method is given in FIGS. 2A-2C. For this alternative, the second substrate 200 includes a cavity 220 provided on its upper face (FIG. 2A) and which, when the transfer of the second substrate 200 onto the first substrate 100 is then carried out, is placed facing the first suspended element 310 and of a zone in which the second suspended element 110 is intended to be made (FIG. 2B).

The second suspended element 110 is then structured in the first substrate 100 and the superficial layer 301. Then, the release of the first suspended element 310 is carried out by removing the sacrificial zones 105 and 315 located therearound (FIG. 2C). With such a cavity 220, an etching of a sacrificial zone located under the suspended elements and provided in a tie layer is not necessary, therefore a step of releasing the second suspended element is no longer necessary.

Another exemplary embodiment is given in FIGS. 3A-3H.

For this other embodiment, after the hole 101 has been formed in the first substrate 100, this hole 101 is filled using the material 102, for example SiO$_2$, such that the material 102 projects from the mouth of the hole 101 and a layer 103 of the material 102 covers the upper face of the first substrate 100.

Then, the first substrate 100 is assembled with the second substrate 200 (FIGS. 3A and 3B), by putting the layer 103 of material 102 flush on the first substrate 100 in contact with the tie layer 201 of the second substrate 200. An oxide-oxide type bonding can for example be carried out when the material 102 and the tie layer 201 are based on SiO$_2$.

Figure 3A:
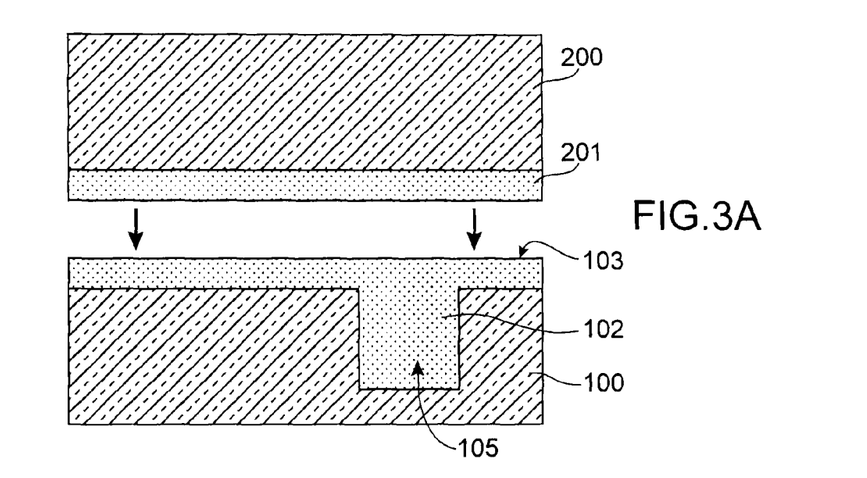
FIGS. 3A to 3H are schematic representations of different steps for making a second embodiment.
Figure 3B:
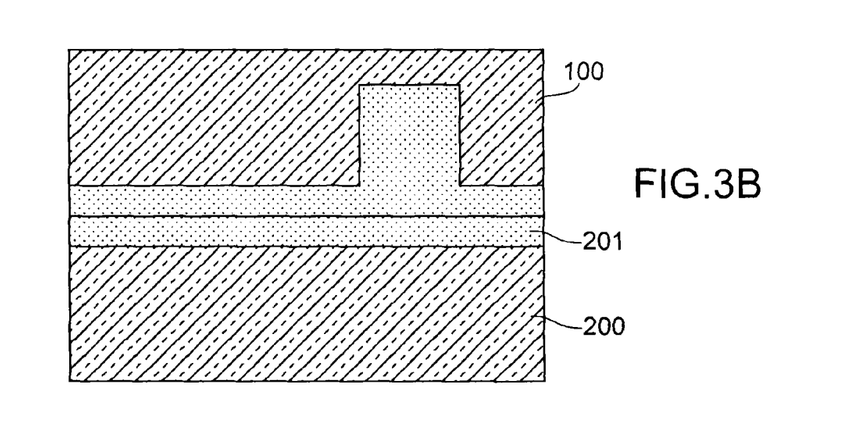
Figure 3C:
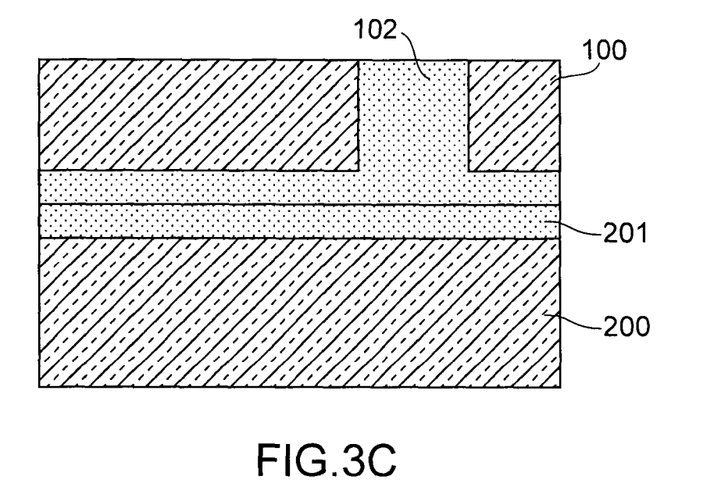
Figure 3D:
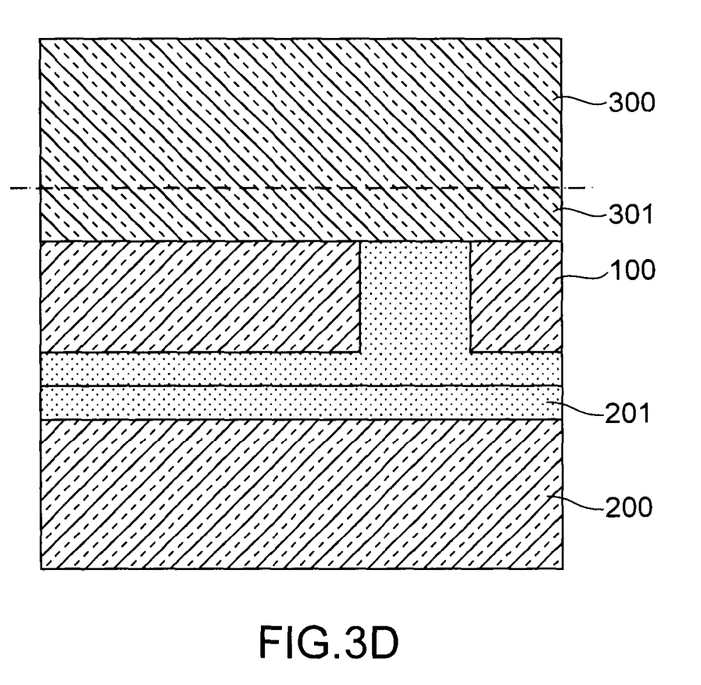

Then, a thinning of the first substrate 100 is carried out so as to remove a thickness located at its lower face, in order to adjust the thickness e$_2$ of the second suspended structure which is intended to be subsequently made (FIG. 3C). The thinning is for example carried out by CMP until the sacrificial zone 105 is reached. The sacrificial zone 105 acts as an etching stop zone.

Then, a transfer of a layer 301 in which the first suspended element and a part of the second suspended element are intended to be formed (FIG. 3D) is carried out. This layer 301 is for example the superficial layer of another semiconductor substrate 300 and is transferred onto the lower face of the first substrate 100, for example by molecular bonding. An accurate alignment of the substrates is thus not necessary.

Figure 3E:
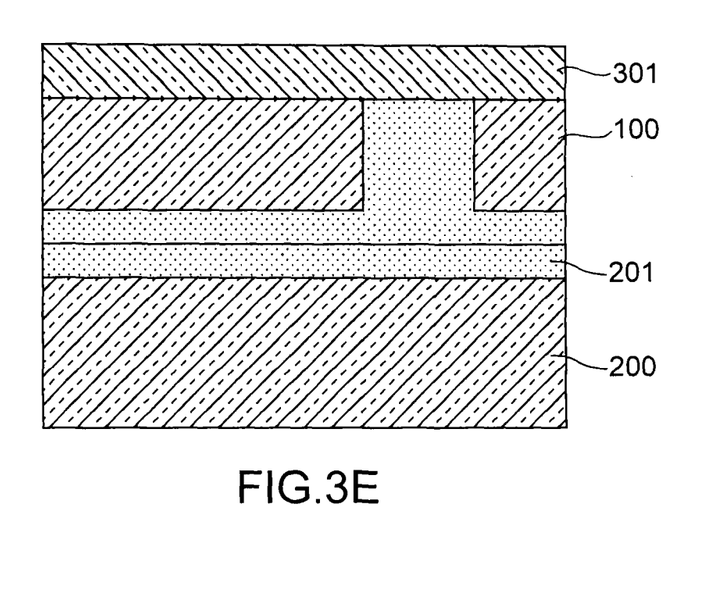
Figure 3F:
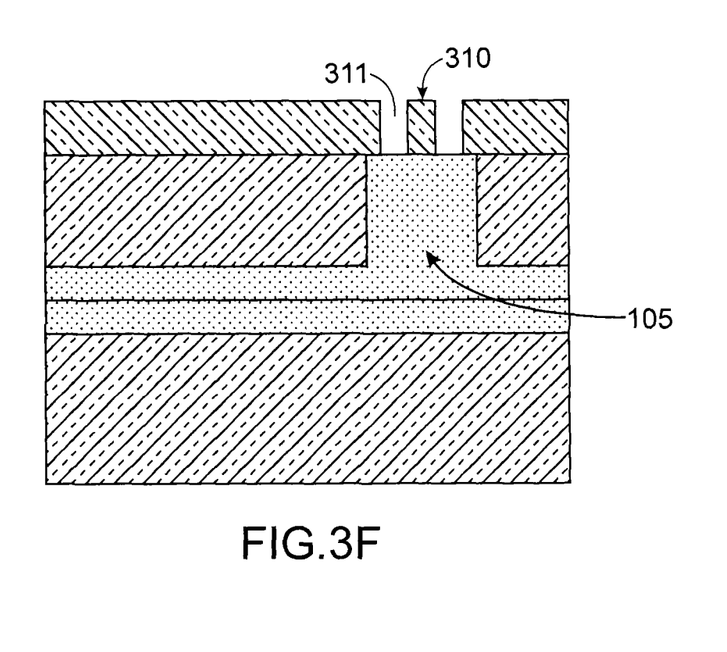
Figure 3G:
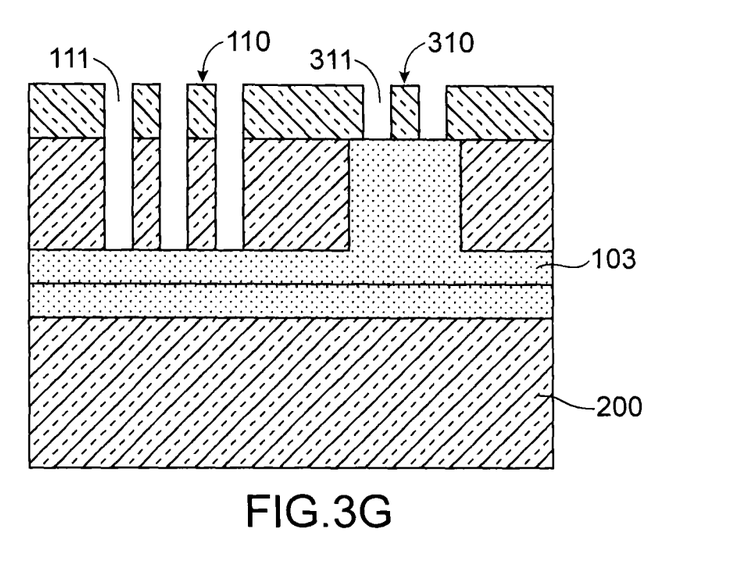

Then, a thinning of the other substrate 300 is carried out for example by a splitting method as previously described, after a longitudinal weakness zone 306 has been created in the other substrate 300 and an annealing has been carried out (FIG. 3E). Then, the first suspended element 310 is defined in the superficial layer 301 (FIG. 3F) surrounded by first trenches 311 the bottom of which reveals the sacrificial layer 105. The second suspended element 110 is also defined partly in the superficial layer 301 and partly in the first substrate 101 (FIG. 3G), such that the second suspended element 110 is surrounded by second trenches 111. The bottom of the second trenches 111 reveals the layer 103 of material 102 located between both substrates 100 and 200.

Figure 3H:
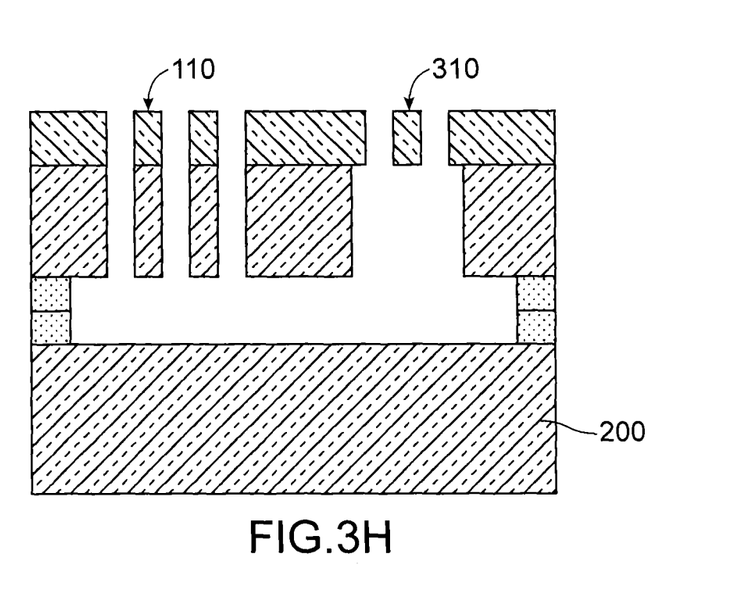

Then, a release of the first suspended element 310 and the second suspended element 110 is carried out by removing the material 102 filling the hole 101 and by removing a portion of the material 102 and of the tie layer 201 which are provided between the first substrate 100 and the second substrate 200 and on which the second structure 110 lies (FIG. 3H).

Figure 4A:
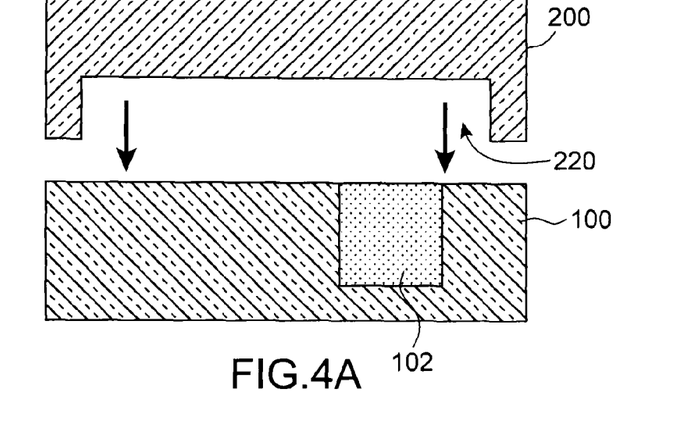
FIGS. 4A to 4C are schematic representations of different steps for making another alternative of the method according to the second embodiment.
Figure 4B:
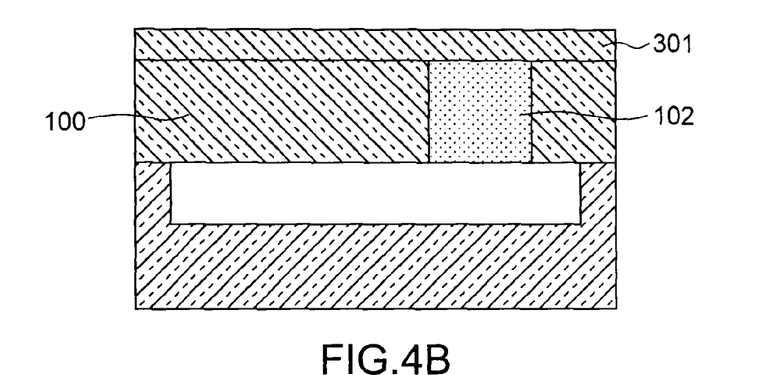
Figure 4C:
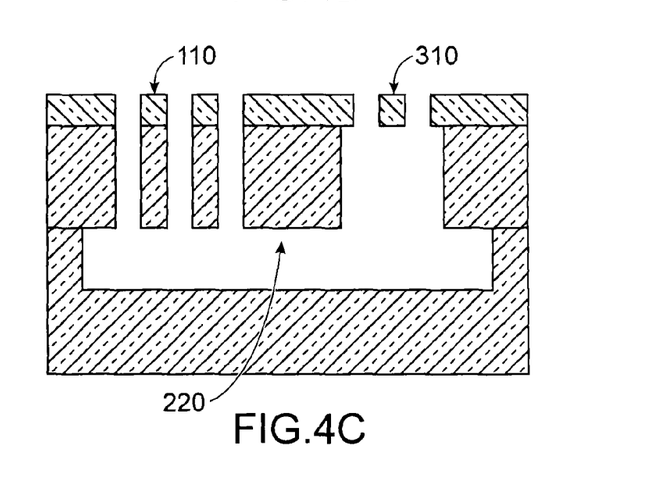

An alternative of the example of method just described is given in FIGS. 4A-4C.

For this alternative, after the hole 101 has been formed in the first substrate 100 and it has been filled with the material 102, then the transfer of the second substrate 200 is carried out onto the first substrate 100. The second substrate includes a cavity 220 provided on its upper face (FIGS. 4A and 4B). The cavity 220 is in particular provided facing a zone of the first substrate 100 in which the second suspended element 110 is intended to be made, as well as facing the sacrificial zone 105 consist of the hole filled with the material 102.

Then, the second suspended element 110 is formed in the first substrate 110 and the superficial layer 301.

Then, the release of the first suspended element 310 is carried out by removing the sacrificial zone 105 and possibly other sacrificial zones therearound (FIG. 4C).

Thanks to the method according to the invention, it is possible not to resort to the use of a semi-conductor on insulator substrate in particular of the SOI (Silicon On Insulator) type and not to carry out epitaxy. Cost and time savings are thus achieved.

It is also possible to carry out a three-dimensioned CMOS co-integration. In this case, the second substrate can for example be a substrate provided with electronic components for example made in CMOS technology.

The method according to the invention is particularly suitable for making microelectromechanical sensors and actuators and/or nano-electromechanical systems, for example such as inertial sensors for accelerometers, gyroscopes, magnetometers, pressure sensors, microphones.

The invention claimed is:

1. A method for making a structure including an active part comprising at least one first suspended element and a second suspended element having different thicknesses, the method comprising:
    forming, in a first substrate, a first sacrificial zone,
    transferring onto a first face of the first substrate a given layer extending at least on the first sacrificial zone,
    defining in said given layer at least one first suspended element on the first sacrificial zone, by forming one or more first trenches in the given layer having a bottom revealing the first sacrificial zone such that the first suspended element is formed from the given layer and is arranged to be in contact with the first sacrificial zone,
    defining at least one second suspended element by forming one or more second trenches in the first substrate and through said given layer, the second suspended element having a thickness higher than the thickness of the first suspended element, and
    releasing at least the first suspended element by removing at least the first sacrificial zone.

2. The method according to claim 1, further comprising, after forming the first sacrificial zone, transferring a second substrate either onto a second face of the first substrate, or on the given layer.

3. The method according to claim 2, wherein prior to defining the second suspended element, the following are made in this order:
transferring the given layer onto the first substrate,
and then defining the first suspended element in said given layer,
and then transferring the second substrate onto the given layer.

4. The method according to claim 3, wherein between the defining the first suspended element in said given layer and the transferring a second substrate onto the given layer, a filling of the first trenches by a sacrificial material is made, the first trenches filled with the sacrificial material forming another sacrificial zone, the releasing the first element comprising removing said other sacrificial zone.

5. The method according to claim 2, wherein prior to defining the second suspended element, the following are made in this order:
the transferring the second substrate onto the first substrate,
and then the transferring said given layer onto the first substrate,
and then the defining the first suspended element in said given layer.

6. The method according to claim 2, wherein the second substrate is assembled to the first substrate or to the given layer via a tie layer including at least one portion provided facing the first suspended element and forming a second sacrificial zone facing which the second suspended element is to be formed, the subsequent release of the first suspended element comprising removing said second sacrificial zone in order to also release the second suspended element.

7. The method according to claim 6, wherein the first and second sacrificial zones are based on a same material.

8. The method according to claim 6, wherein the formation of the second trenches is formed by prolonged etching until the tie layer is reached, the tie layer forming as an etching stop zone.

9. The method according to claim 2, wherein a cavity is provided on a face of the second substrate, the transfer of the second substrate onto the first substrate or the given layer being made such that the cavity is provided facing a region of the first substrate and/or of the given layer in which the first element and the second element are to be formed.

10. The method according to claim 1, wherein the transferring said given layer comprises:
transferring another substrate comprising this given layer or covered with this given layer, and
partially removing this other substrate so as to preserve the given layer on the first substrate.

11. The method according to claim 10, wherein the transfer is made by a direct bonding technique.

12. The method according to claim 1, wherein the given layer is based on a semi-conductor material.

13. The method according to claim 1, wherein the first suspended element has a given width, the hole having a cross-section higher than the given width.

14. The method according to claim 1, wherein the first substrate is a semi-conductor substrate.

15. A method for manufacturing a MEMS and/or NEMS device comprising a method according to claim 1.

16. The method according to claim 12, wherein the semi-conductor material is single crystal silicon.

17. The method according to claim 14, wherein the semi-conductor substrate is made of single crystal silicon.

18. A method for making a structure including an active part comprising at least one first suspended element and a second suspended element having different thicknesses, the method comprising:
forming, in a first substrate, a first sacrificial zone,
transferring onto a first face of the first substrate a given layer extending at least on the first sacrificial zone,
defining in said given layer at least one first suspended element on the first sacrificial zone, by forming one or more first trenches in the given layer having a bottom revealing the first sacrificial zone such that the first suspended element is formed from the given layer,
defining at least one second suspended element by forming one or more second trenches in the first substrate and through said given layer, the second suspended element having a thickness higher than the thickness of the first suspended element, and
releasing at least the first suspended element by removing at least the first sacrificial zone.

19. A method for making a structure including an active part comprising at least one first suspended element and a second suspended element having different thicknesses, the method comprising:
forming, in a first substrate, a first sacrificial zone,
transferring onto a first face of the first substrate a given layer extending at least on the first sacrificial zone,
defining in said given layer at least one first suspended element on the first sacrificial zone, by forming one or more first trenches in the given layer having a bottom revealing the first sacrificial zone,
defining at least one second suspended element by forming one or more second trenches in the first substrate and through said given layer, the second suspended element having a thickness higher than the thickness of the first suspended element, and
releasing at least the first suspended element by removing at least the first sacrificial zone,
after forming the first sacrificial zone, transferring a second substrate either onto a second face of the first substrate, or on the given layer,
wherein the first sacrificial zone is formed by making at least one blind hole through the first or the second face respectively of the first substrate and then filling the hole with at least one first material, the method further comprising, after the transferring the second substrate respectively onto the given layer or onto the first substrate and prior to forming the second suspended element, thinning respectively the second face or the first face of the first substrate so as to remove a thickness of the first substrate which is located on the side opposite to the face from which the blind hole is made, the thinning being continued until the first sacrificial zone is reached, the first sacrificial zone acting subsequently as an etching stop zone.

* * * * *